US006784006B2

(12) United States Patent
Tanimoto et al.

(10) Patent No.: US 6,784,006 B2
(45) Date of Patent: Aug. 31, 2004

(54) SEMICONDUCTOR DEVICE, METHOD OF MANUFACTURING SEMICONDUCTOR DEVICE, AND SYSTEM FOR EVALUATING ELECTRICAL CHARACTERISTICS OF SEMICONDUCTOR DEVICE

(75) Inventors: Hiroyoshi Tanimoto, Kanagawa-ken (JP); Toshiyuki Enda, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/001,977

(22) Filed: Dec. 5, 2001

(65) Prior Publication Data

US 2003/0073256 A1 Apr. 17, 2003

(30) Foreign Application Priority Data

Oct. 11, 2001 (JP) .................................. P2001-313939

(51) Int. Cl.$^7$ .............................................. H01L 21/66
(52) U.S. Cl. .............................. 438/17; 438/14; 438/201
(58) Field of Search ........................ 438/14, 17, 140, 438/149, 151, 201

(56) References Cited

U.S. PATENT DOCUMENTS 5,021,854 A * 6/1991 Huth ........................ 257/438
5,510,630 A * 4/1996 Agarwal et al. ............... 257/77
6,184,556 B1 * 2/2001 Yamazaki et al. ........... 257/354
6,242,784 B1 * 6/2001 Zeng et al. .................. 257/409

OTHER PUBLICATIONS

Robert H. Tu, et al., "Berkeley Reliability Tools–Bert", IEEE Transactions on Computer–Aided Design of Integrated Circuits and Systems, vol. 12, No. 10, Oct. 1993, pp. 1524–1534.

Chenming Hu, et al., "Hot–Electron–Induced MOSFET Degradation–Model, Monitor, and Improvement", IEEE Transactions on Electron Devices, vol. ED–32, No. 2, Feb. 1985, pp. 375–385.

* cited by examiner

Primary Examiner—Amir Zarabian
Assistant Examiner—Pamela E Perkins
(74) Attorney, Agent, or Firm—Oblon, Spivak, McClelland, Maier & Neustadt, P.C.

(57) ABSTRACT

A method of manufacturing a semiconductor device, comprises: forming a semiconductor element in a semiconductor active region, and calculating the generation rate of electron hole pairs generated due to impact ionization caused in the semiconductor element; calculating a volume integral of the generation rate at least in an area where the impact ionization is caused; evaluating time-dependent degradations of electrical characteristics of the semiconductor element on the basis of the volume integral; and manufacturing a semiconductor device on the basis of the evaluation.

15 Claims, 8 Drawing Sheets

| $I_{subQ}/Id$ ratio \ $Id[A]$ | 0.0001 | 0.0002 | 0.0005 | 0.001 | 0.002 |
|---|---|---|---|---|---|
| 0.01 | 5.0E-08 | 1.3E-07 | 4.8E-07 | 1.3E-06 | 3.3E-06 |
| 0.02 | 7.5E-07 | 2.0E-06 | 7.1E-06 | 1.9E-05 | 5.0E-05 |
| 0.05 | 2.7E-05 | 7.0E-05 | 2.5E-04 | 6.7E-04 | 1.8E-03 |
| 0.1 | 4.0E-04 | 1.1E-03 | 3.8E-03 | 1.0E-02 | 2.6E-02 |
| 0.2 | 5.9E-03 | 1.6E-02 | 5.7E-02 | 1.5E-01 | 3.9E-01 |

Fig. 7

| $I_{subQ}/I_d$ ratio \ $I_d[A]$ | 0.0001 | 0.0002 | 0.0005 | 0.001 | 0.002 |
|---|---|---|---|---|---|
| 0.01 | 4.7E-08 | 1.3E-07 | 4.9E-07 | 1.2E-06 | 3.6E-06 |
| 0.02 | 7.0E-07 | 1.9E-06 | 7.3E-06 | 1.9E-05 | 5.3E-05 |
| 0.05 | 2.5E-05 | 6.7E-05 | 2.6E-04 | 6.6E-04 | 1.9E-03 |
| 0.1 | 3.7E-04 | 1.0E-03 | 4.0E-03 | 1.1E-02 | 2.5E-02 |
| 0.2 | 5.8E-03 | 1.5E-02 | 5.9E-02 | 1.4E-01 | 4.0E-01 |

Fig. 8

START
↓
Applying Bias to Semiconductor Element at Ambient Temperature — S110
↓
Measuring Operation Temperature T of Semiconductor Element — S111
↓
Measuring $I_{subQ}$, $I_d$ & $V_{th}$ at Operation Temperature T — S112
↓
Creating Data on $I_{subQ}$, $I_d$ & $V_{th}$ — S113
↓
Calculating Variations of Electric Characteristics at Operation Temperature T Based on Created Data — S114
↓
END

Fig. 9

| $I_{subQ}/Id$ ratio \ $Id[A]$ | 0.0001 | 0.0002 | 0.0005 | 0.001 | 0.002 |
|---|---|---|---|---|---|
| 0.01 | 8.4E-08 | 2.3E-07 | 8.8E-07 | 2.3E-06 | 5.5E-06 |
| 0.02 | 1.3E-06 | 3.4E-06 | 1.3E-05 | 3.4E-05 | 8.1E-05 |
| 0.05 | 4.5E-05 | 1.2E-04 | 4.7E-04 | 1.2E-03 | 2.9E-03 |
| 0.1 | 6.7E-04 | 1.7E-03 | 6.0E-03 | 1.6E-02 | 4.1E-02 |
| 0.2 | 9.8E-03 | 2.6E-02 | 9.0E-02 | 2.5E-01 | 6.6E-01 |

SEMICONDUCTOR DEVICE, METHOD OF MANUFACTURING SEMICONDUCTOR DEVICE, AND SYSTEM FOR EVALUATING ELECTRICAL CHARACTERISTICS OF SEMICONDUCTOR DEVICE

CROSS REFERENCE TO RELATED APPLICATION

This application is based upon and claims the benefit of priority from the prior Japanese Patent Application No. 2001-313939 filed on Oct. 11, 2001, the entire contents of which are incorporated herein by reference.

BACKGROUND OF THE INVENTION

1. Field of the Invention

The invention relates to a semiconductor device, a method of manufacturing such a semiconductor device, and a system for evaluating electrical characteristics of the semiconductor device. Particularly, the invention relates to a semiconductor device which is preferable to evaluating time-dependent degradations of electrical characteristics of a semiconductor element, a method of manufacturing such a semiconductor device, and an electrical characteristics evaluating system.

2. Description of the Related Art

It is well-known that a MOSFET (metal oxide semiconductor field effect transistor) such as a silicon element varies its electrical characteristics with time. Generally speaking, electrical characteristics of a semiconductor device become worse with a lapse of time. The semiconductor device is required to remain reliable for a long period of time like 10 or 20 years during the normal use. In other words, the semiconductor device should maintain its electrical characteristics within a product specification limit even when they are degraded during the use.

It is empirically known that degradations of electrical characteristics of the MOSFET are predictable by monitoring a substrate current. For example, refer to C. Hu et al. "Hot-Electron-Induced MOSFET Degradation-Model, Monitor and Improvement" (IEEE Transactions on Electron Devices, Vol. ED-32, 1985). This reference describes that degradations of electrical characteristics depend upon the substrate current as follows. Some hot carriers which are given energy by a electric field tend to damage a gate insulated film or the like, form levels in an interface of the gate insulated film, and are trapped in the gate insulated film, thereby degrading electrical characteristics of the semiconductor element.

Further, hot carriers in a semiconductor substrate cause impact ionization therein. Then, electron hole pairs will be generated. Charges which are opposite to those constituting a channel flow through the semiconductor substrate as a substrate current. For instance, in the case of an n-channel conductivity type MOSFET, charges constituting the channel are electrons, so that the holes flow through the semiconductor substrate as a substrate current. In short, the degradations of electrical characteristics and the substrate current are caused by the carriers of the high energy condition in the MOSFET. For this reason, it is predictable that the degradations of electrical characteristics of the MOSFET and the substrate current are correlated. The relation has been empirically established between the degradations of electrical characteristics and the substrate current. Therefore, it is possible to predict the degraded electrical characteristics of the MOSFET by monitoring the substrate current.

Generally, semiconductor elements whose electrical characteristics extensively degrade during the initial stage of use tend to maintain the initially degraded state. Conversely, semiconductor elements having excellent electrical characteristics at the initial stage, i.e. semiconductor elements having a high current value, tend to extensively degrade during the use because they tend to have the carriers of the high energy condition. In other words, initial electrical characteristics and degradation resistance are contradictory with each other. It is natural to manufacture semiconductor devices having excellent initial electrical characteristics taking the degradation resistance into consideration. Such semiconductor devices should have electrical characteristics defined by their specification with respect to the lifetime expectancy. In short, if a semiconductor device has excessively long life, it means that its electrical characteristics may be sacrificed.

It is therefore very important to evaluate the degradations of electrical characteristics when manufacturing semiconductor devices. The degradations of electrical characteristics of the semiconductor device are evaluated by monitoring the degradation of electrical characteristics when stress of direct current (DC stress) is applied to a semiconductor element. For instance, the degradations of electrical characteristics after an electronic circuit is assumed to be used for ten years are evaluated as follows. A dynamic stress which varies with time is primarily applied to a semiconductor element for constituting an electronic circuit. The degradations of electrical characteristics are evaluated assuming that a half of the whole DC stress for ten years is applied to the semiconductor element (The approach of "duty factor".), and that electrical characteristics of the semiconductor element are degraded to a level in which the DC stress has been applied for five years. This evaluation is performed on the basis of the degradation of electrical characteristics due to the DC stress although the dynamic stress is primarily applied to the semiconductor element. Therefore, the foregoing evaluation method cannot be always precise.

On the contrary, the BERT (Berkeley Reliability Tool) developed by University of California at Berkeley, U.S.A. uses the circuit simulation technique in order to reliably evaluate the degradations of electrical characteristics of a semiconductor device as described hereinafter.

First of all, a dynamic circuit simulation is performed for a semiconductor element which is free from any degradation of electrical characteristics. A substrate current or the like of the semiconductor element which constitutes a circuit and is in a dynamic state is calculated as a function of time. For instance, the degradations of electrical characteristics of the semiconductor element in a certain time period are evaluated on the basis of the relationship between a time integral of physical quantities including a calculated substrate current $I_{sub}(t)$, and an empirically created relationship between the substrate current and degradations of electrical characteristics.

$$\left(\frac{I_{sub}(t)}{Id(t)}\right)^{\alpha} Id(t)^{\beta}$$

where Id denotes a drain current, and $\alpha$ and $\beta$ denote model parameters.

Degraded electrical characteristics of the circuit are evaluated on the basis of degradations of electrical characteristics of the semiconductor element derived using the foregoing process.

This method is effective in evaluating the degraded electrical characteristics of the semiconductor element taking dynamic stresses into consideration, and is more reliable than the evaluation method using the DC stress.

However, the foregoing evaluation methods seem to have the following problems.

(1) In the foregoing circuit simulation, the influence of the semiconductor element which constitutes a circuit in operation and is in non-equilibrium cannot be precisely taken into consideration. For instance, it is well-known that carrier energies in a semiconductor element are in non-equilibrium in the following semiconductor elements: a semiconductor element whose channel length is short compared with an mean free path of carriers; a semiconductor element in which an electric field varies very steeply; a semiconductor element to which a voltage is applied and in which an electric field steeply varies with time, or the like. The electrical characteristics of such semiconductor elements cannot be precisely evaluated through the circuit simulation, and a substrate current cannot be correctly calculated. Therefore, the degradations of electrical characteristics cannot be precisely evaluated.

(2) In a semiconductor device in which polycrystalline silicon is used as a semiconductor active region and a semiconductor element is formed in the semiconductor active region, carriers in the semiconductor active region have short lifetimes. In other words, electron hole pairs caused by impact ionization are excessively recombined in the semiconductor active region, and most of them disappear due to recombination, so that only part of generated carriers are observed as a substrate current. In such a semiconductor element, the substrate current is no longer an index representing the carriers of the high energy condition in the semiconductor region, so that no correlation can be usually established between the substrate current and the degradation of electrical characteristics. Therefore, the degradations of electrical characteristics of the semiconductor element cannot be precisely evaluated on the basis of the substrate current even when the circuit simulation is performed.

(3) No substrate current is present in a semiconductor device having the SOI (silicon-on-insulator) structure in which a semiconductor element is formed in a semiconductor active region which is made of single crystal silicon and is provided on a silicon substrate via a silicon oxide film. This is because there is no substrate electrode. Therefore, the degradation of electrical characteristics cannot be evaluated since no substrate current can be calculated even if the circuit simulation is performed.

BRIEF SUMMARY OF THE INVENTION

According to a first aspect of the invention, there is provided a method of manufacturing a semiconductor device, comprising: forming a semiconductor element in a semiconductor active region, and calculating the generation rate of electron hole pairs caused by impact ionization in the semiconductor element; calculating a volume integral of the generation rate of electron hole pairs at least in an area where the impact ionization is caused; evaluating time-dependent variations of electrical characteristics of the semiconductor element on the basis of the volume integral; and manufacturing a semiconductor device on the basis of evaluation results.

In accordance with a second aspect of the invention, there is provided a method of manufacturing a semiconductor device, comprising: forming a semiconductor element in a semiconductor active region, and calculating the generation rate of electron hole pairs caused by impact ionization in the semiconductor element; calculating a volume integral of the generation rate of electron hole pairs at least in an area where the impact ionization is caused; calculating a time integral of physical quantities including the volume integral; evaluating time-dependent variations of electrical characteristics of the semiconductor element on the basis of the time integral; and manufacturing a semiconductor device on the basis of evaluation results.

According to a third aspect of the invention, there is provided a method of manufacturing a semiconductor device, comprising: forming a first insulated gate field effect transistor having a body contact electrode in a first semiconductor active region on an insulated layer at least on a substrate, measuring at least a body current of the first semiconductor active region and creating data concerning at least the body current; forming a second insulated gate field effect transistor without a body contact electrode in a second semiconductor active region on the insulated film layer, and calculating the generation rate of electron hole pairs caused by impact ionization in the second insulated gate field effect transistor; calculating a volume integral of the generation rate of electron hole pairs at least in a region where impact ionization is caused; calculating time-dependent variations of electrical characteristics of the second insulated gate field effect transistor on the basis of the volume integral and at least the body current in the data; and manufacturing a semiconductor device on the basis of the calculated time-dependent variations of electrical characteristics.

With a fourth aspect of the invention, there is provided a method of manufacturing a semiconductor device, comprising: performing initial designing of a semiconductor element to be formed in a semiconductor active region; calculating the generation rate of electron hole pairs caused by impact ionization in the semiconductor element; calculating a volume integral of the generation rate of electron hole pairs at least in a region where the impact ionization is caused; evaluating time-dependent variations of electrical characteristics of the semiconductor element on the basis of the volume integral; and redesigning the semiconductor element on the basis of evaluation results.

According to a fifth aspect of the invention, there is provided a method of manufacturing a semiconductor device, comprising: forming a semiconductor element in a semiconductor active region and calculating the generation rate of electron hole pairs caused by impact ionization in the semiconductor element; calculating a volume integral of the generation rate of electron hole pairs at least in a region where the impact ionization is caused; calculating a physical model quantity after application of stresses to the semiconductor element, on the basis of the volume integral; evaluating time-dependent variations of electrical characteristics after application of stress to the semiconductor element, on the basis of the calculated physical model quantity; and manufacturing a semiconductor device on the basis of evaluation results.

In accordance with a sixth aspect of the invention, there is provided a semiconductor device comprising: a substrate provided with an insulated layer at least on a surface thereof; a first semiconductor active region on the insulated layer of the substrate; a first insulated gate field effect transistor formed in the first semiconductor active region, provided with a body contact electrode and used for detecting a body current; a second semiconductor active region on the insulated layer of the substrate; and a second insulated gate field effect transistor formed in the second semiconductor active region and having no body contact electrode.

According to a seventh aspect of the invention, there is provided an electrical characteristic evaluating system comprising: a data inputting unit inputting physical model quantity data of a semiconductor element; a data processing unit calculating on the basis of the input data the generation rate of electron hole pairs caused by impact ionization in the semiconductor element, calculating a volume integral of the generation rate of electron hole pairs at least in a region where the impact ionization is caused, and calculating time-dependent variations of the semiconductor element at least on the basis of the volume integral; and a data outputting unit for outputting the calculated time-dependent variations of electrical characteristics.

DETAILED DESCRIPTION OF THE INVENTION

The invention will be described with reference to semiconductor devices, methods of manufacturing such semiconductor devices, and systems for evaluating electrical characteristics of the semiconductor devices, which are shown in the drawings. Throughout the drawings, like or corresponding parts are denoted by like or corresponding reference numbers. It should be noted that the drawings are schematic and that scales shown in the drawings may differ from those of the actual devices.

(First Embodiment of the Invention)

A first embodiment relates to a semiconductor device having the SOI structure, a method of manufacturing such a semiconductor device, and a system for evaluating electrical characteristics of the semiconductor device.

[Basic Structure of Semiconductor Device with SOI Structure]

Figure 1:
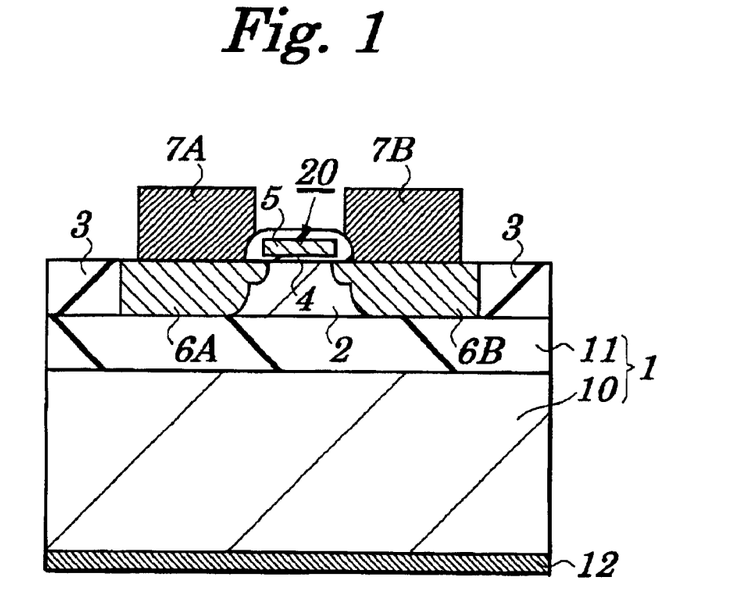
FIG. 1 is a cross section of a semiconductor device according to a first embodiment of the invention, taken along line F1—F1 in FIG. 2.
Figure 2:
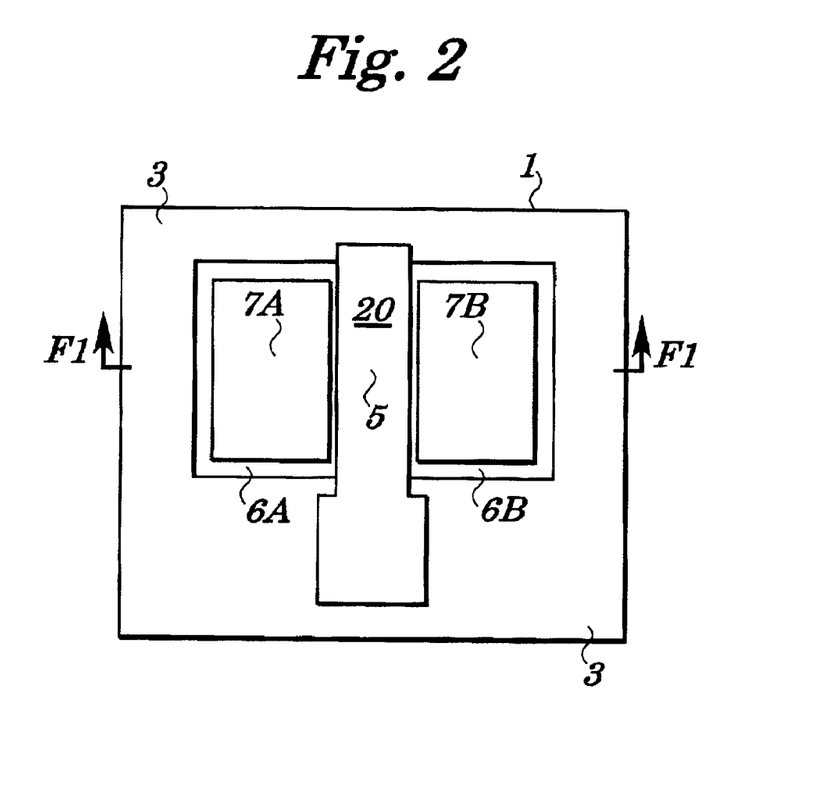
FIG. 2 is a top plan view of the semiconductor device of FIG. 1.

Referring to FIG. 1 and FIG. 2, the semiconductor device comprises at least a substrate 1 having an insulated layer 11 at least on its surface, a semiconductor active region 2 on the insulated layer 11, and a semiconductor element 20 in the semiconductor active region 2.

The substrate 1 includes a support substrate 10, the insulated layer 11 on an upper surface of the support substrate 10, and a support substrate electrode 12 at the bottom of the support substrate 10 in order to maintain the support substrate 10 at a predetermined potential, e.g. the grounding potential or 0 V. The insulated layer 11 is preferably a silicon oxide film prepared by the thermal oxidation, CVD (chemical vapor deposition), sputtering, SIMOX (separation by implantation of oxygen) or the like. In the case of SIMOX, oxygen atoms are implanted into a bulk near the upper surface of the support substrate 10 using high energy ions, and the silicon oxide film is formed by reacting the oxygen atoms and silicon atoms in the support substrate 10.

The semiconductor active region 2 has its bottom and opposite sides defined by the insulated layer 11 and an element isolating region 3, respectively, as shown in FIG. 1, and is isolated from another semiconductor active region 2, the support substrate 10 and so on. The semiconductor active region 2 serves as a region for forming an operation region of the semiconductor element 20. In this embodiment, the semiconductor active region 2 is preferably made of single crystal silicon. Alternatively, the semiconductor active region 2 may be made of at least polycrystalline silicon or amorphous silicon.

The element isolating region 3 is preferably a silicon oxide film prepared by the thermal oxidation, for example, and has a trench in which an insulator such as a silicon oxide film or the like may be embedded.

The semiconductor element 20 is an n-channel conductivity type IGFET, which may be at least a MOSFET, a MISFET (metal insulator semiconductor field effect transistor), a TFT (thin film transistor) or the like. Further, the IGFET may be of a p-channel conductivity type. Still further, the IGFET may be of a complementary type with both the n-conductivity type and p-channel conductivity type.

In other words, the semiconductor element 20 comprises: the semiconductor active region 2 functioning as a body region; a gate insulated film 4 on the semiconductor active region 2; a control electrode (a gate electrode) 5 on the gate insulated film 4; a first main electrode 6A provided in the semiconductor active region 2 and functioning as a source or drain region; and a second main electrode 6B provided in the semiconductor active region 2 and functioning as a drain or source region.

The gate insulated film 4 is preferably made of a single layer of a silicon oxide film, a silicon nitride film, a oxynitride film and so on, or a composite film of a silicon oxide film, silicon nitride film, a oxynitride film and so on. The control electrode 5 is preferably made of a single layer of a polycrystalline silicon film, a silicide film of a refractory metal, a refractory metal film and so on, or a composite film constituted by the silicide film and the polycrystalline silicon film laid thereon, a composite film constituted by the polycrystalline silicon film and the refractory metal film laid thereon, or the like. The first and second main electrodes 6A and 6B preferably have the LDD (lightly doped drain) structure, for example.

A first main electrode terminal 7A is made of an aluminum alloy (e.g. Al—Si, Al—Cu, Al—Cu—Si and so on.) film, a copper film, a refractory metal film or the like, and is electrically connected on the first main electrode 6A. A second main electrode terminal 7B is identical to the first main electrode terminal 7A, and is connected on the second main electrode 6B.

[Semiconductor Device Manufacturing Method]

Figure 3:
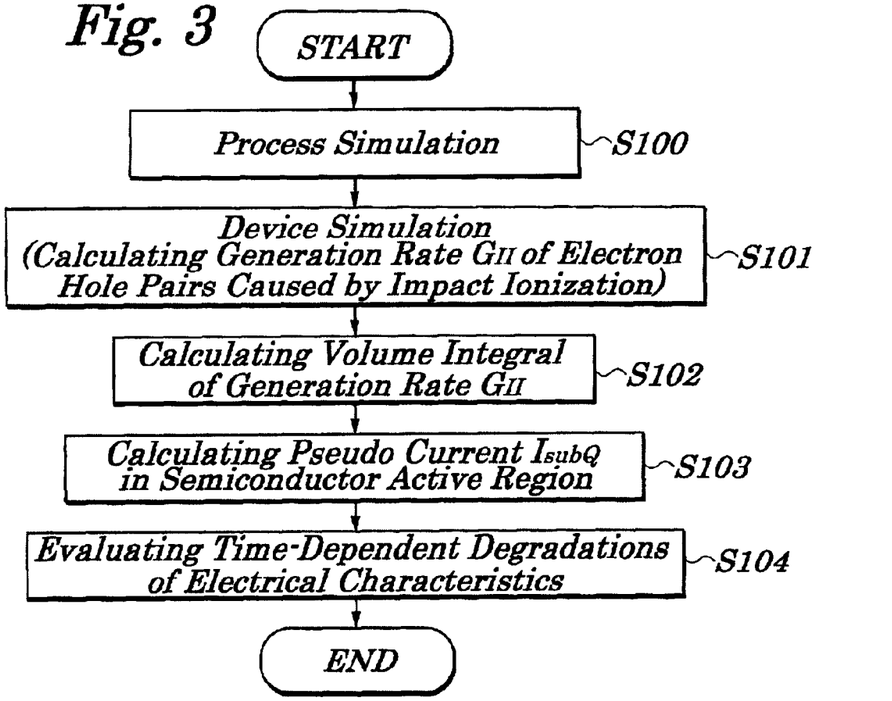
FIG. 3 is a flowchart showing the procedure for manufacturing the semiconductor device according to the first embodiment.

FIG. 3 shows a method of manufacturing the semiconductor device. The method is executed at an initial designing stage and includes a process for evaluating time-dependent degradations of electrical characteristics of the semiconductor device. It is assumed here that the semiconductor element 20 is an n-channel conductivity type IGFET, and that time-dependent degradations of electrical characteristics of the semiconductor element 20 are evaluated.

(1) First of all, a process simulation is performed (step S100). At least the following are inputted for the process simulation; information concerning a kind of a manufacturing process such as an ion implanting process, a thermal oxidation process, a deposition process or the like; manufacturing conditions such as an amount of impurities to be dosed, thermal oxidation temperatures, deposition conditions and so on; and information concerning shapes of masks and so on. Further, information concerning a shape of an insulated film and so on and information concerning density distributions of impurities are calculated in the process simulation. Specifically, the following are calculated: thickness and so on of an insulated film of the semiconductor element 20, i.e. the thickness of the insulated film 4 (e.g. a silicon oxide film) of the n-channel conductivity type IGFET; and the impurity density distribution of the semiconductor active region 2.

(2) A device simulation is performed (step S101). Stress conditions such as stress voltages and stress time are inputted. Electrical characteristics of the IGFET are calculated on the basis of the stress conditions. The electrical characteristics include at least the generation rate $G_{II}$ of electron hole pairs which are caused due to impact ionization in the semiconductor active region 2 under the stress conditions. A potential distribution in the n-channel conductivity type IGFET, a carrier density distribution, a drain current and so on are calculated on the basis of the foregoing impurity density distribution, stress condition and so on.

(3) A volume integral of the generation rate $G_{II}$ of electron hole pairs is calculated at least in a region where the impact ionization is caused in the semiconductor active region 2 (step S102). A minimum practical region to be calculated is one hundredth of a peak value of the generation rate $G_{II}$ of electron hole pairs caused by impact ionization. On the contrary, a maximum practical region for calculating the generation rate $G_{II}$ of electron hole pairs substantially covers the semiconductor active region 2 including the body region, and first and second main electrodes 6A and 6B.

(4) A product of the volume integral and an elementary electric charge q is derived using the following formula after calculating the volume integral of the generation rate $G_{II}$ of electron hole pairs. Thereafter, a pseudo current (body current) $I_{subQ}$ flowing through the semiconductor active region 2, which is equivalent to a substrate current flowing through a silicon bulk, is calculated using the following formula <1> (step S103).

$$I_{subQ} = q \int_V G_{II} \, dv \qquad \langle 1 \rangle$$

(5) Time-dependent degradations of electrical characteristics of the IGFET are evaluated on the basis of the calculated pseudo current $I_{subQ}$ and an empirical relation formula between a substrate current generated in a normal silicon substrate (bulk) and degradations of electrical characteristics of a normal semiconductor element in the normal silicon substrate (S104). Actually, time-dependent degradations of the IGFET are evaluated on the basis of variations $\Delta V_{th}$ of a threshold voltage, shown at the formula <2>, in response to the degradations of electrical characteristics.

$$\Delta V_{th} = A \left( \frac{I_{subQ}}{Id} \right)^\alpha Id^\beta \qquad \langle 2 \rangle$$

where Id denotes a drain current, A denotes a model parameter, $\alpha$ denotes a model parameter, $\beta$ denotes a model parameter (e.g. $\beta \approx 1.4$).

For instance, in the IGFET, it is assumed that the variation $\Delta V_{th}$ of the threshold voltage after ten-year use is empirically derived and is 50 mV. If the variation $\Delta V_{th}$ of the threshold voltage $V_{th}$ which is derived using the foregoing formulas <1> and <2> after applying stresses equivalent to ten-year use is above 50 mV, the variations $\Delta V_{th}$ are evaluated to be outside a product specification limit at the initial designing stage. Conversely, if the variations $\Delta V_{th}$ are equal to or less than 50 mV, the variations $\Delta V_{th}$ are evaluated to be within the product specification limit. The variations $\Delta V_{th}$ are described here as a parameter representing the time-dependent degradations of the electrical characteristics. Alternatively, variations of a driving current of the IGFET may be also used as a parameter representing the time-dependent degradations of the electrical characteristics, or may be used together with the variations $\Delta V_{th}$. A 5%-variation of the driving current of the IGFET is marginal in the product specification limit, for example.

(6) Thereafter, a semiconductor device will be manufactured in accordance with evaluated time-dependent degradations of the electrical characteristics of the IGFET (the semiconductor element 20).

[Evaluation of Degradations of Electrical Characteristics of Semiconductor Element]

Time-dependent degradations of electrical characteristics of the semiconductor element 20 can be evaluated for the following reasons.

When a semiconductor element formed on an ordinary silicon substrate (e.g. a MOSFET, a bulk element) is active, carriers in the silicon substrate (silicon activation region) receive energy from an electric field. Some carriers having high energy cause impact ionization, and produce electron hole pairs. An ordinary silicon substrate has a substrate electrode. For example, the substrate electrode applies a circuit grounding potential, e.g. 0 V, to a p-type silicon substrate. Most of generated carriers having a opposite charge to that of constituting a channel are not recombination, reach the substrate electrode, and are observed as a substrate current. In the case of an n-channel conductive MOSFET, most of the holes generated by impact ionization are not recombination, reach the substrate electrode, and are observed as a substrate current.

In the semiconductor device with the SOI structure according to the first embodiment, carriers in the semiconductor active region 2 receive energy from the electric field during the active state of the semiconductor element 20 (i.e. the n-channel conductivity type IGFET). Some carriers having high energy cause the impact ionization, and generate electron hole pairs. However, since there is no the substrate electrode (body electrode) for applying a potential of the semiconductor active region 2, no body current corresponding to the substrate current can be observed.

In the first embodiment, the generation rate $G_{II}$ of electron hole pairs caused by impact ionization in the semiconductor active region 2 can be calculated by the device simulation (step S101). Substantially most of the generated carriers having the opposite charge to that of constituting the channel are observed as the substrate current as described above. Therefore, the pseudo current (body current) $I_{subQ}$ corresponding to substrate current in the IGFET can be calculated by deriving the product of the volume integral of the generation rate $G_{II}$ of electron hole pairs caused by impact ionization and the elementary electric charge q. The pseudo current $I_{subQ}$ is a physical quantity representing a state of carriers having high energy in the IGFET similarly to the substrate current. Time-dependent degradations of electrical characteristics of the IGFET can be predicted by comparing the variations $\Delta V_{th}$ of the threshold voltage of the IGFET or the variations of the driving current, on the basis of the pseudo current $I_{subQ}$ and the empirical relation formula between the substrate current and the degradation of electrical characteristics.

In the formula <1>, the volume integral of the generation rate $G_{II}$ of electron hole pairs caused by impact ionization is calculated for the semiconductor active region 2. Further, the volume integral of the generation rate $G_{II}$ of electron hole pairs caused by impact ionization can be calculated by performing a two-dimensional device simulation in X and Y directions assuming that a depth direction or a Z direction is uniform. In other words, in the two-directional device simulation, a two-dimensional surface integral of the generation rate $G_{II}$ of electron hole pairs in the semiconductor active region 2 is calculated. The volume integral of the generation rate $G_{II}$ of electron hole pairs can be derived by calculating a product of the surface integral and the depth.

With the foregoing method, the pseudo current $I_{subQ}$ flowing through the semiconductor active region 2 can be derived by calculating the generation rate $G_{II}$ of electron hole pairs and the volume integral thereof. Even when the current flowing through the semiconductor active region 2 cannot be directly detected due to the absence of the substrate electrode or the body electrode, time-dependent degradations of electrical characteristics of the semiconductor element 20 can be reliably evaluated on the basis of the pseudo current $I_{subQ}$. Therefore, evaluation results are reflected on the semiconductor device manufacturing process, so that a semiconductor device with excellent time-dependent variations of electrical characteristics can be manufactured, which is effective in improving a manufacturing yield of semiconductor device.

Especially, the manufacturing method of the first embodiment is preferable to the evaluation of time-dependent degradations of electrical characteristics of the semiconductor element 20 which includes the semiconductor active region 2 made of polycrystalline silicon or amorphous silicon. This is because electron hole pairs are easily recombined in such a semiconductor active region 2, it is difficult to observe a body current, and the body current cannot serve as an index representing carriers having high energy in the semiconductor active region 2.

[Basic Configuration of System for Evaluating Electrical Characteristics of Semiconductor Device]

Figure 4:
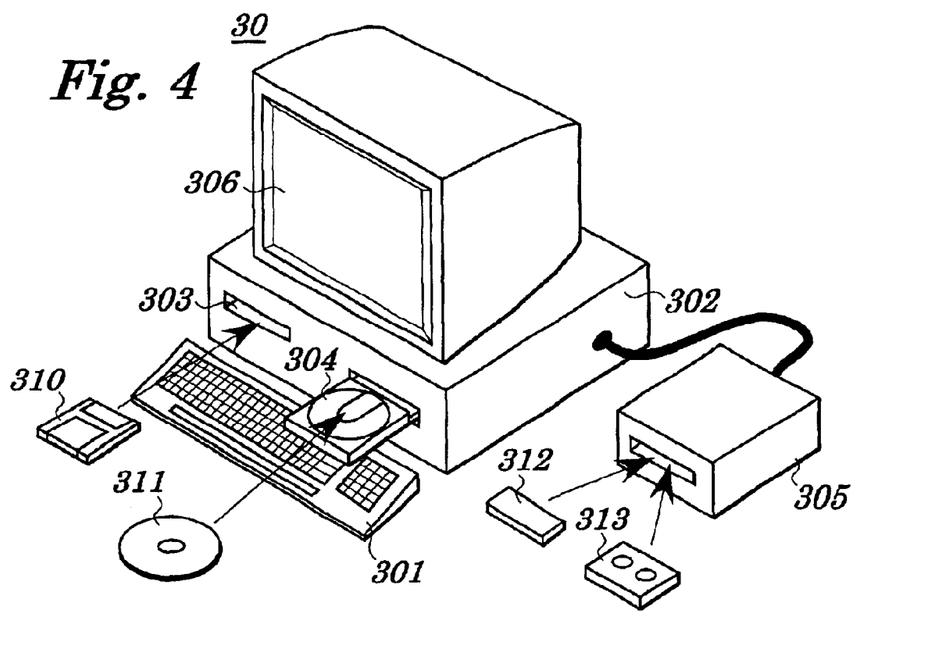
FIG. 4 shows the configuration of a system for evaluating electrical characteristics of the semiconductor device according to the first embodiment.

The time-dependent degradations of electrical characteristics of the semiconductor element 20 are evaluated using an evaluation system 30 as shown in FIG. 4. The evaluation system 30 comprises at least: a data input unit 301 for inputting physical model quantities of the semiconductor element 20; a data processing unit 302 for calculating the generation rate $G_{II}$ of electron hole pairs caused by impact ionization, the volume integral of the generation rate $G_{II}$ of electron hole pairs, and time-dependent degradations of electrical characteristics of the semiconductor element 20 at least on the basis of the volume integral; and a data output unit 306 for outputting the calculated time-dependent degradations of electrical characteristics.

Referring to FIG. 4, the evaluation system 30 is realized by a personal computer system. Specifically, the data input unit 301 may be a keyboard, and may be used together with an auxiliary unit such as a mouse, a pen and so on.

Although not shown in detail, the data processing unit 302 is provided at least with a built-in memory (e.g. a hard disc, a RAM (random access memory), a ROM (read only memory) or the like) which stores software for carrying out the manufacturing method (for evaluating the time-dependent degradations of electrical characteristics) according to the first embodiment. In addition, the data processing unit 302 has a central processing unit (CPU) for executing such software. Further, the data processing unit 302 includes not only a disc drive 303 for a floppy disc 310 and an optical disc drive 304 for an optical disc 311 but also an external memory unit such as a storage drive 305 for a non-volatile memory card 312 (e.g. a flash EEPROM card) or a storage tape 313. The external memory unit is arranged outside the evaluation system 30. The foregoing software is stored in the floppy disc 310, optical disc 311, non-volatile memory card 312 or storage tape 313, and is installed in the built-in memory of the data processing unit 302.

The data output unit 306 is preferably a cathode ray tube (CRT) display, a liquid crystal display or the like, and may be provided with a printer, a projector or the like.

The evaluation system 30 of this embodiment is effective in carrying out the semiconductor device manufacturing method, i.e. evaluating the time-dependent degradations of electrical characteristics of the semiconductor element 20, without the necessity of special equipment, at a reduced cost, and with reliability.

[Modified Example of First Embodiment]

The first embodiment is also applicable to a semiconductor device of the SOS (silicon on sapphire) structure in which a semiconductor active region 2 is formed on an insulated sapphire substrate and a semiconductor element is formed therein, a method of manufacturing such a semiconductor device, and a system 30 for evaluating electrical characteristics of the semiconductor device.

(Second Embodiment of the Invention)

A second embodiment relates to a semiconductor device in which a semiconductor element is formed in an electrically floating well region, a method of manufacturing such a semiconductor device, and a system for evaluating electrical characteristics of the semiconductor device.

[Basic Configuration of Semiconductor Device]

Figure 5:
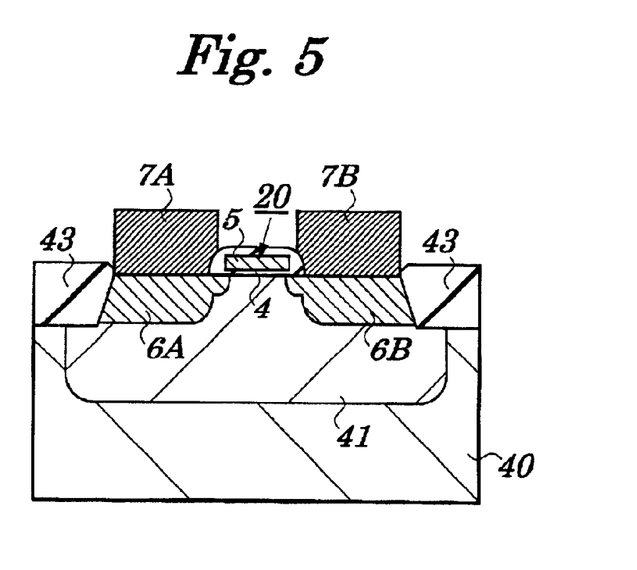
FIG. 5 is a cross section of a semiconductor device according to a second embodiment of the invention.

Referring to FIG. 5, a semiconductor device comprises at least a semiconductor element 20 formed on a semiconductor active region 41 which is electrically isolated from other regions by the p-n junction isolation and is in an electrically floating state.

The semiconductor active region 41 is provided on a main surface of a substrate 40. The semiconductor element 20 is an n-channel conductivity type IGFET, the substrate 40 is an n-type single crystal silicon substrate, and the semiconductor active region 41 is a p-type well region. Needless to say, when the semiconductor element 20 is a p-channel conductivity type IGFET, the substrate 40 is a p-type single crystal silicon substrate, and the semiconductor active region 41 is an n-type well region. In this embodiment, the semiconductor active region 41 is electrically isolated from the substrate 40 by the p-n junction isolation.

Although not shown in FIG. 5, the substrate 40 is provided with a substrate electrode on its front or rear surface, but the semiconductor active region 41 does not essentially include a well electrode for applying its potential. Therefore, it is impossible to observe a well current (corresponding to a substrate current) flowing through the semiconductor active region 41, as with the semiconductor active region 2 of the first embodiment.

The semiconductor element 20 is essentially identical to the semiconductor element 20 of the first embodiment. Specifically, the semiconductor element 20 is provided in the main surface of the semiconductor active region 41 surrounded by an element isolating region 43, and is constituted by: the semiconductor active region 41; a gate insulated film 4 on the semiconductor active region 41; a gate electrode 5 on the gate insulated film 4; a first main electrode 6A provided in the semiconductor active region 41 and functioning as a source or drain region; and a second main electrode 6B provided in the semiconductor active region 41 and functioning as a drain or source region. Further, a first main electrode terminal 7A is electrically connected on the first main electrode 6A, and a second main electrode terminal 7B is electrically connected on the second main electrode 6B.

The element isolating region 43 is preferably made of a silicon oxide film prepared by the LOCOS (local oxidation of silicon).

[Semiconductor Device Manufacturing Method]

A semiconductor device manufacturing method of this embodiment is substantially identical to that for the semiconductor device of the first embodiment. The method comprises at least: forming the semiconductor element 20 (e.g. an n-channel conductivity type IGFET) in the semiconductor active region 41 (e.g. a p-type well region) which is electrically isolated from the substrate 40 by the p-n junction isolation, and calculating the generation rate $G_{II}$ of electron hole pairs caused by impact ionization in the semiconductor element 20; calculating a volume integral of the generation rate $G_{II}$ of electron hole pairs at least in an area where the impact ionization is caused; evaluating time-dependent degradations of electrical characteristics of the semiconductor element 20 at least on the basis of the calculated volume integral; and manufacturing the semiconductor device on the basis of the evaluation results.

The manufacturing method of this embodiment is as effective and advantageous as that of the first embodiment.

Especially, the manufacturing method of the embodiment is optimum for evaluation of time-dependent degradations of electrical characteristics of the semiconductor element 20 when it is difficult to observe the well current in the semiconductor active region 41 which is electrically isolated from other regions by the p-n junction isolation and is in an electrically floating state.

[Basic Configuration of System for Evaluating Electrical Characteristics]

A system for evaluating electrical characteristics of this embodiment is identical to the evaluation system 30 in the first embodiment shown in FIG. 4, and will not be described here.

[Modified Example of Second Embodiment]

The second embodiment is also applicable to a semiconductor device in which a bottom of the semiconductor active region 41 (shown in FIG. 5) is of the p-n junction isolation type, and the element isolating region 43 is constituted by an insulator embedded in a trench in order to isolate the sides of the semiconductor active region 41, a method of manufacturing such a semiconductor device, and a system for evaluating electrical characteristics of the semiconductor device.

(Third Embodiment of the Invention)

In a third embodiment, time-dependent degradations of electrical characteristics of a semiconductor element are evaluated on the basis of data created beforehand in the method of the first or second embodiment.

[Evaluation on the Basis of Empirical Data]

The manufacturing method of this embodiment comprises at least evaluating time-dependent degradations of electrical characteristics of the semiconductor element 20 (i.e. an n-channel conductivity type IGFET) by comparing time-dependent variations of a threshold voltage of the semiconductor element 20 with data which are empirically prepared beforehand, and represent a stress condition, variations of a threshold voltage under the stress condition.

Figure 6:
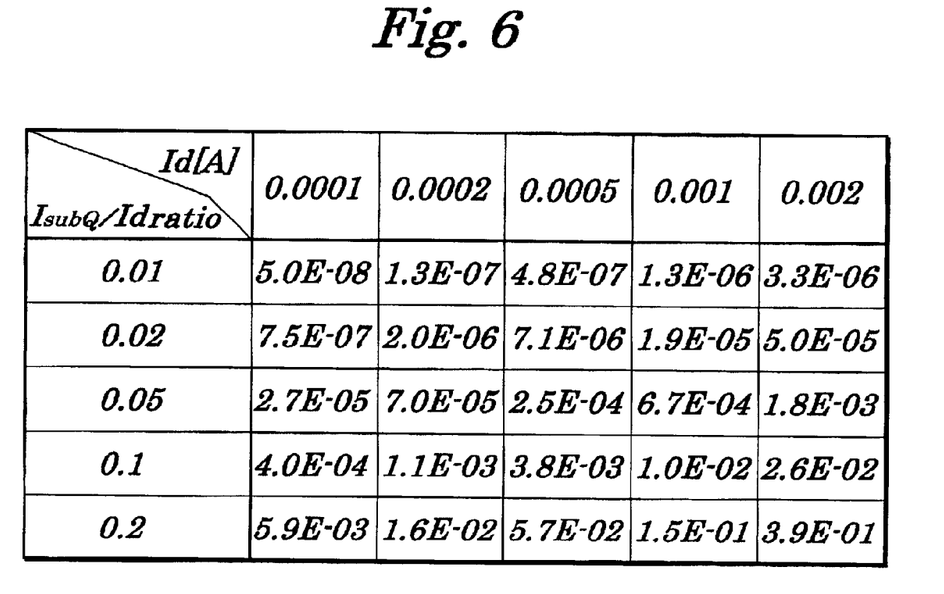
FIG. 6 is a graph showing data for manufacturing a semiconductor device according to a third embodiment of the invention.

The data used for the evaluation are prepared in the form of a table as shown in FIG. 6, which is easy to use. In FIG. 6, the abscissa denotes a drain current Id [A] while the ordinate denotes a ratio between the drain current Id [A] and a pseudo current (a body or well current) $I_{subQ}$ flowing through the semiconductor active region 2 or 41. The contents of the table represent variations $\Delta V_{th}$ [V] of the threshold voltage before and after electrical characteristics are degraded after the application of DC stress for 1000 seconds (i.e. (the threshold voltage $V_{th}$ the after degradation)−(the threshold voltage $V_{th}$ before the degradation)). The variations $\Delta V_{th}$ can be empirically derived using the foregoing formula <2>.

The table in FIG. 6 shows the variations $\Delta V_{th}$ of the IGFET when one stress condition is applied thereto. In actual cases, data are created with respect to a plurality of stress conditions, or data obtained for respective semiconductor elements 20 (i.e. the IGFETs having different channel lengths) are collected.

After preparing the foregoing data, the generation rate $G_{II}$ of electron hole pairs caused by impact ionization is calculated, and a volume integral of the generation rate $G_{II}$ of electron hole pairs is calculated, as described with respect to the first embodiment. Thereafter, a product of the volume integral and an elementary electric charge q is derived using the formula <1>, so that the pseudo current $I_{subQ}$ will be calculated. The data are inputted into the evaluation system 30 (shown in FIG. 4) using the data input unit 301, before or after the process simulation (step S100), and before the device simulation (step S101) in the manufacturing method related to the first embodiment.

If necessary, data are appropriately interpolated referring to the table in FIG. 6, so that degradations of electrical characteristics of the IGFET are evaluated by calculating the variations $\Delta V_{th}$ of the threshold voltage of the stressed IGFET on the basis of the pseudo current $I_{subQ}$ and the drain current Id (DC stress current).

[Evaluation on the Basis of Actually Collected Data]

In the third embodiment, the empirically obtained data are not used, but actually collected data concerning the stress condition and the variations of the threshold voltage under the stress condition for a predetermine time period are prepared beforehand. Time-dependent variations of the threshold voltage of the n-channel conductivity type IGFET may be evaluated on the basis of the actually collected data.

Figure 7:
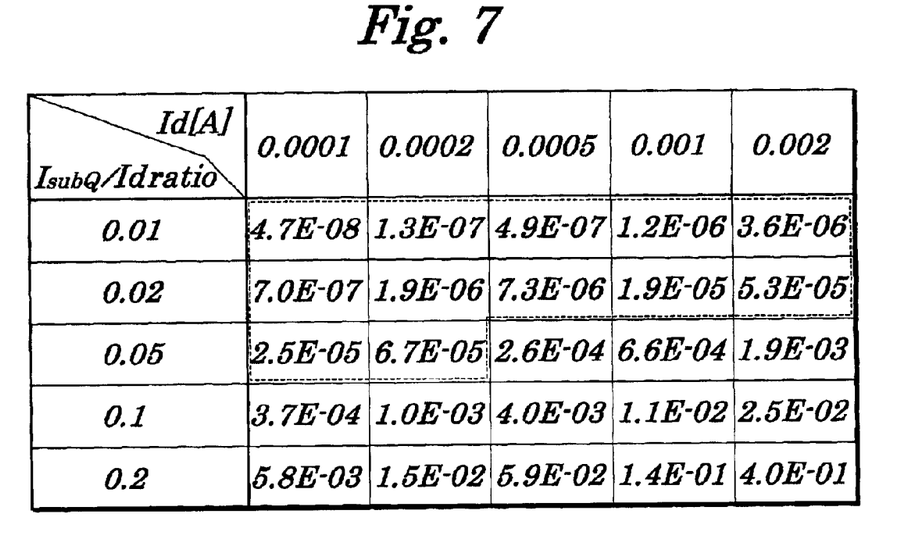
FIG. 7 is a graph showing different data for manufacturing the semiconductor device in the third embodiment.

The foregoing data are prepared in the form of a table as shown in FIG. 7, similarly to the table in FIG. 6, which is easy to use. In FIG. 7, the abscissa denotes a drain current Id [A] while the ordinate denotes a ratio between the drain current Id [A] and a pseudo current (a body or well current) $I_{subQ}$ flowing through the semiconductor active region 2 or 41. The contents of the table represent variations $\Delta V_{th}$ [V] of the threshold voltage before and after electrical characteristics are degraded after the application of DC stress for 1000 seconds (i.e. (the threshold voltage $V_{th}$ the after degradation)−(the threshold voltage $V_{th}$ before the degradation)). In FIG. 7, an area defined by a dotted line represents variations $\Delta V_{th}$ which are derived using the following formula <3>, because they cannot be actually measured using a measuring unit. It is not convenient to leave the area blank.

$$\Delta V_{th} \propto \left(\frac{I_{subQ}}{Id}\right)^\alpha \quad \langle 3 \rangle$$

where α denote a model parameter (e.g. α≈−3.9)

The table in FIG. 7 shows the variations $\Delta V_{th}$ of the IGFET when one stress condition is applied thereto. In actual cases, data are collected for a plurality of stress conditions, or data obtained for respective semiconductor elements 20 (having different channel lengths) are collected.

After preparing the foregoing data, the generation rate $G_{II}$ of electron hole pairs caused by impact ionization is calculated, and a volume integral of the generation rate $G_{II}$ of electron hole pairs is calculated, as described with respect to the first embodiment. Thereafter, a product of the volume integral and an elementary electric charge q is derived using the formula <1>, so that the pseudo current $I_{subQ}$ will be calculated. If necessary, the data are appropriately interpolated referring to the table in FIG. 7, so that degradations of electrical characteristics of the IGFET are evaluated by calculating the variations $\Delta V_{th}$ of the threshold voltage of the stressed IGFET on the basis of the pseudo current $I_{subQ}$ and the drain current Id (DC stress current).

The manufacturing method of the third embodiment is as effective and advantageous as that of the first embodiment.

Further, the manufacturing method is effective in improving the precision of evaluation of the time-dependent degradations of the electrical characteristics of the semiconductor element 20 since either the empirically created data or the actually collected data are used.

(Fourth Embodiment of the Invention)

In this embodiment, time-dependent degradations of electrical characteristics of a semiconductor element are evaluated by considering dynamic stresses in the semiconductor device manufacturing method according to the first or second embodiment.

The manufacturing method comprises: forming the semiconductor element 20 in either the semiconductor active region 2 or 41; calculating the generation rate $G_{II}$ of electron hole pairs caused by impact ionization in the semiconductor element 20: calculating a volume integral of the generation rate $G_{II}$ of electron hole pairs at least in a area where the impact ionization is caused; calculating a time integral of physical quantities including the volume integral; evaluating time-dependent degradations of electrical characteristics of the semiconductor element 20 on the basis of at least the time integral; and manufacturing a semiconductor device on the basis of evaluation results.

Variations $\Delta V_{th}$ of a threshold voltage can be expressed by the following formula <4> when a DC stress is applied to the semiconductor element 20 for time $t_{stress}$.

$$\Delta V_{th} = A \left(\frac{I_{subQ}}{Id}\right)^\alpha Id^\beta t_{stress} \quad \langle 4 \rangle$$

Further, variations $\Delta V_{th}$ of the threshold voltage derived using the formula <4> can be rewritten as following formula <5>.

$$\Delta V_{th} = A \left[\int_0^{stress} \left(\frac{q \int G_{II}(t, V)}{Id(t)}\right)^\alpha Id^\beta(t) dt\right] \quad \langle 5 \rangle$$

It is possible to predict the variations $\Delta V_{th}$ of the threshold voltage of the IGFET in which dynamic stresses are taken into consideration.

With the manufacturing method of this embodiment where the time integral of physical quantities including the volume integral is calculated, time-dependent degradations of electrical characteristics of the semiconductor element 20 can be precisely evaluated taking the dynamic stresses into consideration.

(Fifth Embodiment of the Invention)

A semiconductor device manufacturing method of this embodiment is substantially identical to the manufacturing method of the first or second embodiment, but includes evaluating time-dependent degradations of electrical characteristics of a semiconductor element 20 taking an operation temperature into consideration.

Specifically, data which represent the relationship between stress conditions at the operation temperature and variations $\Delta V_{th}$ of a threshold voltage in a predetermined time period under the stress conditions are prepared beforehand. The time-dependent degradations of electrical characteristics of the semiconductor element 20 are evaluated on the basis of the prepared data.

In the semiconductor device having the SOI structure of the first embodiment, an element temperature of the semiconductor element 20 (i.e. the n-channel conductivity type IGFET) is raised compared with an ambient temperature (e.g. a measuring temperature). If the element temperature varies, the drain current Id and so on also vary. Generally speaking, time-dependent degradations of electrical characteristics depend upon temperatures. When time-dependent degradations of electrical characteristics of the operating n-channel conductivity type IGFET are evaluated on the basis of actually measured time-dependent degradations of electrical characteristics, the data should be prepared considering stresses applied to the semiconductor device at the operation temperature.

Figure 8:
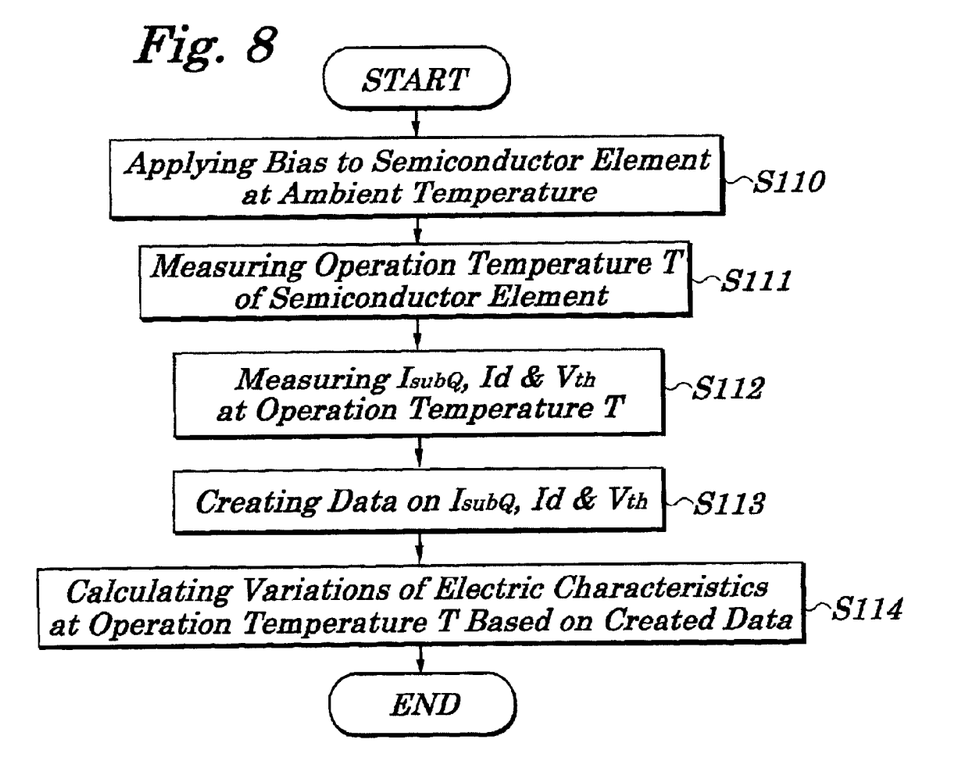
FIG. 8 is a flowchart showing the procedure for manufacturing a semiconductor device according to a fifth embodiment of the invention.

FIG. 8 shows the procedure for evaluating the time-dependent degradations of electrical characteristics of the IGFET.

(1) First of all, a bias same as that at a normal operating condition is applied to the n-channel conductivity type IGFET at an ambient temperature of 25° C., for example (step S110).

(2) An element temperature T of the IGFET is measured (step S111).

(3) At the foregoing temperature T, measurements are performed for at least a pseudo current $I_{subQ}$ flowing through the semiconductor active region 2 or 41, the drain current Id and the variations $\Delta V_{th}$ of the threshold voltage (step S112). Then, the generation rate $G_{II}$ of electron hole pairs in the semiconductor element 20 is calculated, and the pseudo current $I_{subQ}$ is calculated on the basis of a product of a volume integral and an elementary electric charge q using the formula <1>. Further, the variations $\Delta V_{th}$ are derived using the formula <2>. Physical quantities which cannot be measured by a measuring unit are calculated using the formula <3>.

Figure 9:
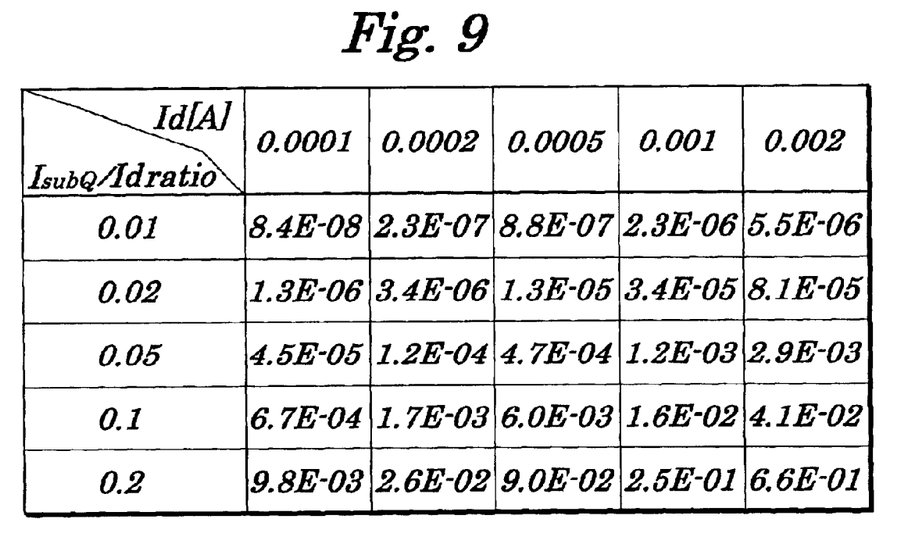
FIG. 9 is a graph showing data for manufacturing a semiconductor device in the fifth embodiment.

(4) Data concerning the relationships between the pseudo current $I_{subQ}$, drain current Id and variations $\Delta V_{th}$ are created on the basis of the measured physical quantities, as shown in FIG. 9 (step S113). In FIG. 9, the abscissa denotes the drain current Id [A] while the ordinate denotes a ratio between the drain current Id and the pseudo current (body or well current) $I_{subQ}$. The contents of FIG. 9 are the variations $\Delta V_{th}$ [V] which are actually measured after heating the IGFET at the operation temperature T of 70° C. and applying a DC stress to the IGFET for 1,000 seconds.

(5) Data are appropriately interpolated with reference to the actually collected data, so that time-dependent degradations of the n-channel conductivity type IGFET at the operation temperature T are evaluated (step S114).

In the fifth embodiment, time-dependent degradations of electrical characteristics of the semiconductor element 20 can be precisely evaluated on the basis of the data which are created beforehand taking the operation temperature T into consideration.

(Sixth Embodiment of the Invention)

In this embodiment, the semiconductor device manufacturing method of the first or second embodiment is modified in order that time-dependent degradations of electrical characteristics of a semiconductor element (n-channel conductivity type IGFET) can be made substantially equal to product specification margins at an initial designing stage.

Figure 10:
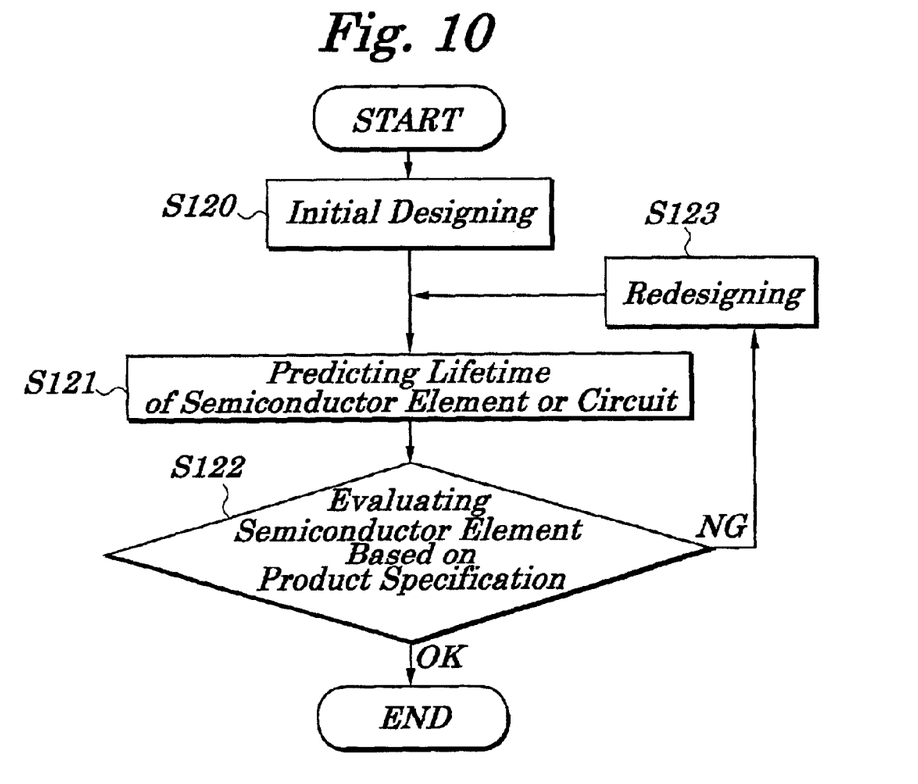
FIG. 10 is a flowchart showing the procedure for manufacturing a semiconductor device according to a sixth embodiment of the invention.

The manufacturing method will be described with reference to FIG. 10.

(1) First of all, the n-channel conductivity type IGFET is formed on the semiconductor active region 2 or 41, i.e. the initial designing (step S120). In this step, the IGFET is designed after determining the following: an impurity density of the semiconductor active region 2 or 41; conditions for implanting ions into the first and second main electrodes 6A and 6B of the semiconductor element 20; conditions for diffusing ion-implanted impurities; and LDD lengths of the first and second main electrodes 6A and 6B when the LDD structure is employed.

(2) A lifetime of the n-channel conductivity type IGFET or a circuit constituted by the IGFET is predicted (step S121) by evaluating time-dependent degradations of electrical characteristics of the IGFET, particularly the variations $\Delta V_{th}$ of the threshold voltage, which are derived on the basis of the following: the generation rate $G_{II}$ of electron hole pairs; and a volume integral of the generation rate $G_{II}$ of electron hole pairs for at least an area where the impact ionization is caused.

(3) In step S122, it is judged whether or not the n-channel conductivity type IGFET or the circuit constituted by it satisfies a product specification of the semiconductor device. For instance, it is judged whether or not the variations $\Delta V_{th}$ of the threshold voltage are below 50 mV of the IGFET after ten-year use.

(4) When the n-channel conductivity type IGFET is judged to be satisfactory, a next step is executed in order to manufacture a semiconductor device which meets the product specification and is relatively free from time-dependent degradations of electrical characteristics. Conversely, if the IGFET is not judged to meet the requirements, it will be redesigned in accordance with the product specification (step S123).

In this embodiment, the time-dependent degradations of electrical characteristics are evaluated in any of the manufacturing methods according to the first to fifth embodiment after the initial designing of the semiconductor element 20. Therefore, the semiconductor device whose time-dependent degradations of electrical characteristics substantially satisfy the product specification can be designed and manufactured.

(Seventh Embodiment of the Invention)

A semiconductor manufacturing method of this embodiment is substantially identical to any one of the methods of the first to sixth embodiment, but time-dependent degradations of electrical characteristics of a semiconductor element are evaluated on a physical model quantity different from those of the first to sixth embodiments.

Figure 11:
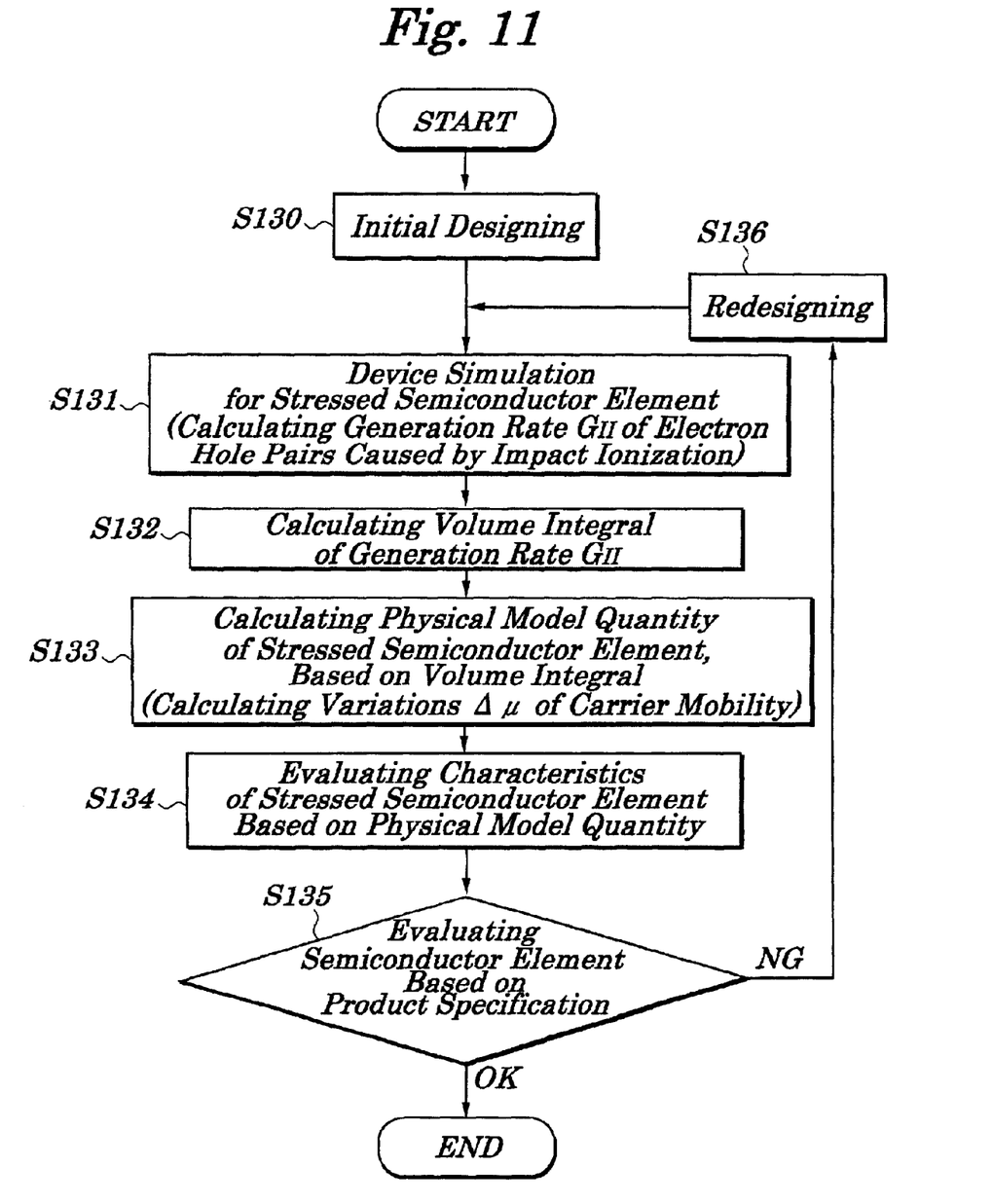
FIG. 11 is a flowchart showing the procedure for manufacturing a semiconductor device according to a seventh embodiment of the invention.

The method of this embodiment is executed by the procedure shown in FIG. 11.

(1) First of all, the semiconductor element 20 (i.e. the n-channel conductivity type IGFET) is formed on the semiconductor active region 2 or 41, i.e. the initial designing is executed in order to manufacture the semiconductor element (step S130).

(2) Electrical characteristics of the IGFET under stressed condition is calculated by device simulation. At least the generation rate $G_{II}$ of electron hole pairs caused by impact ionization is calculated (step S131).

(3) A volume integral of the generation rate $G_{II}$ of electron hole pairs is calculated at least in a region where the impact ionization is caused (step S132).

(4) A physical model quantity of the n-channel conductivity type IGFET in the stressed state is calculated on the basis of at least the volume integration (step S133). Variation $\Delta \mu$ of a mobility of channel carriers in the IGFET are calculated as the physical model quantity. In this case, the carriers are electrons. The variations $\Delta \mu$ are calculated using formulas <6> and <7>.

$$\Delta \mu = \mu_1 - \mu_0 \qquad <6>$$

$$\frac{\Delta \mu}{\mu_0} = A \left( \frac{q \int G_{II} dv}{Id} \right)^\alpha Id^\beta \qquad <7>$$

where $\mu_0$ denotes a mobility of carriers before the application of stresses, and $\mu_1$ denotes a mobility of carriers after the application of stresses.

(5) Time-dependent degradations of electrical characteristics of the stressed n-channel conductivity type IGFET are evaluated on the basis of the calculated variation $\Delta \mu$ (step S134).

(6) Thereafter, if necessary, it is judged whether or not the IGFET satisfies the product specification limits on the basis of the foregoing evaluation (step S135), as in the sixth embodiment. If the IGFET is not judged to be satisfactory, i.e. it has the variations $\Delta \mu$ above 5%, redesigning will be executed (step 136). Conversely, when the IGFET is satisfactory, a next step will be executed in order to manufacture a semiconductor device which has substantially few time-dependent degradations of electrical characteristics.

In this embodiment, the channel carrier mobility of the n-channel conductivity type IGFET is used as the physical model quantity. Alternatively, the time-dependent degradations of electrical characteristics may be evaluated on the basis of at least a density of an interface level of the semiconductor active region 2 or 41 near a gate insulated film 4 or at least one physical model quantity such as a density of charges trapped in the gate insulated film 4, or on the basis of a plurality of physical mode quantities in combination.

Further, the method of this embodiment can reliably re-create the correlation between the time-dependent degradation of electrical characteristics of the semiconductor element 20 and the physical model quantity, and allow precise device simulation. Therefore, it is possible to design and manufacture the semiconductor device whose time-dependent degradations of electrical characteristics are substantially within the product specification limit at the initial designing stage.

(Eighth Embodiment of the Invention)

This embodiment is substantially identical to the first embodiment, but differs from it in the following. Time-dependent degradations of electrical characteristics are observed using a test semiconductor element which is identical to a semiconductor element to be evaluated. Time-dependent degradations of the test semiconductor element are actually observed, and data thereof are collected and used for evaluating the semiconductor element to be actually manufactured.

[Basic Configuration of Semiconductor Element]

Figure 12:
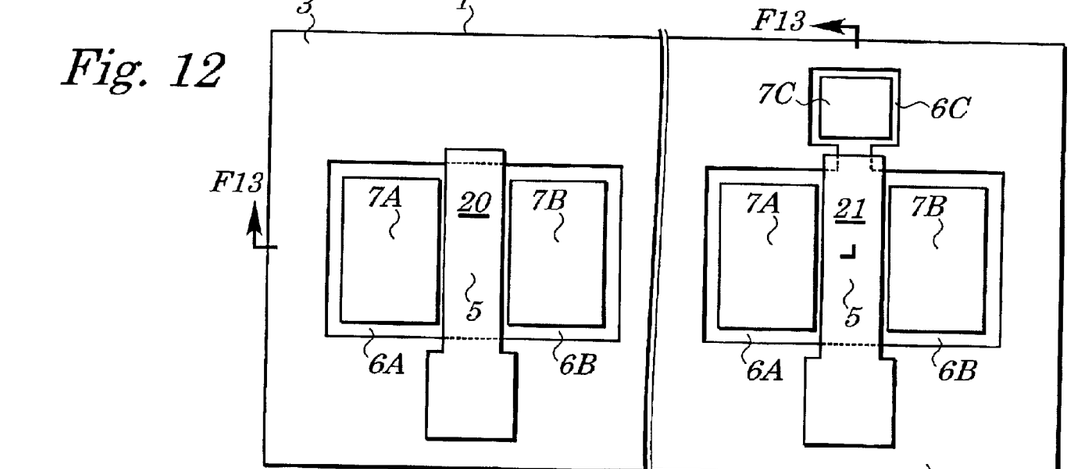
FIG. 12 is a top plan view of a semiconductor device according to an eighth embodiment of the invention.
Figure 13:
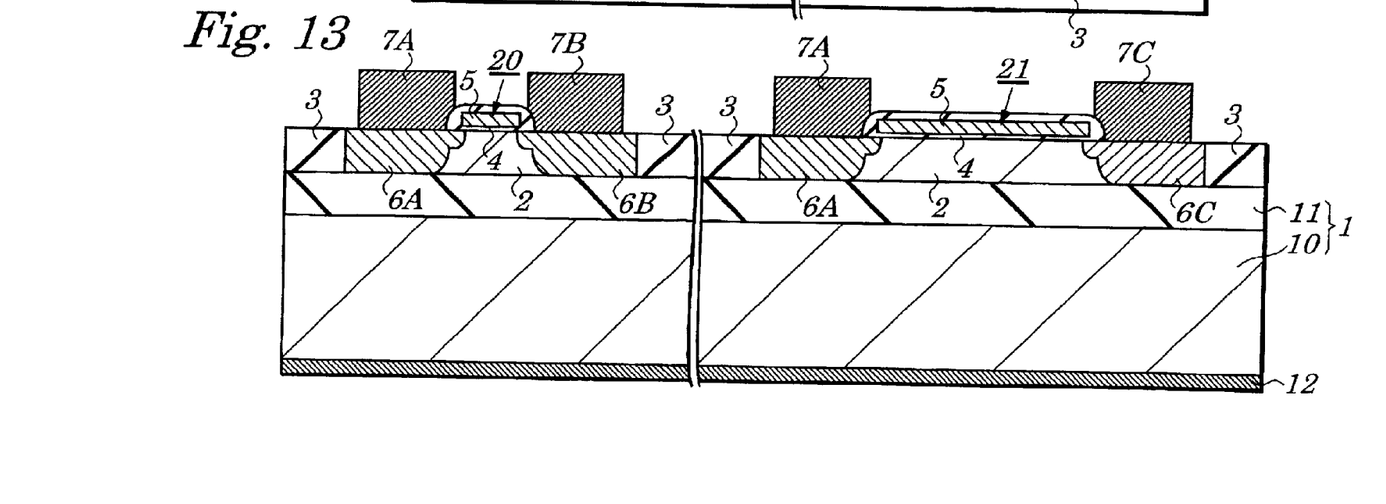
FIG. 13 is a cross section of the semiconductor device in FIG. 12, taken along line F13—F13 in FIG. 12.

Referring to FIG. 12 and FIG. 13, the semiconductor device comprises: a substrate 1 having an insulated layer 11 at least on its surface; a first semiconductor active region 2 on the insulated later 11; a first semiconductor element 21 for detecting a body current, formed on the first semiconductor active region 2 and having a body conduct electrode 7C; and a second semiconductor active region 2 on the insulated layer 11; and a second semiconductor element 20 formed on the second semiconductor active region 2 and having no body conduct electrode 7C.

The substrate 1 includes a support substrate 10 and the insulated layer 11 on the support substrate 10, similarly to the substrate 1 of the first embodiment. The second semiconductor element 20 is identical to the semiconductor element 20 of the first embodiment, is an n-channel conductivity type IGFET, for example, and is designed in order to actually constitute a semiconductor integrated circuit.

The first semiconductor element 21 is fundamentally identical to the second semiconductor element 20, and is constituted by: the first semiconductor active region 2 functioning as a body region; a gate insulated film 4 on the first semiconductor active region 2; a gate electrode 5 on the gate insulated film 4; a first main electrode 6A arranged in the first semiconductor active region 2 and functioning as either a source or drain region; and a second main electrode 6B arranged in the semiconductor active region 2 and functioning as either a drain or source region. Further, the first semiconductor element 21 includes a body contact region 6C for detecting a body current flowing through the first semiconductor active region 2. The body contact region 6C is electrically connected to the body contact electrode 7C. When the first semiconductor element 21 is an n-channel conductivity type IGFET, the body contact region 6C has the same conductivity type as that of the first semiconductor active region 2, and is made of p-type semiconductor region having a high impurity density compared with that of the first semiconductor active region 2. If the semiconductor device is provided with a complementary IGFET, the body contact region 6C can be manufactured in a process for manufacturing a main electrode of the p-channel conductivity type IGFET without increasing the number of manufacturing steps.

The first semiconductor element 21 is preferably formed on the same substrate (the same semiconductor wafer) of the second semiconductor element 20, in a semiconductor chip forming region (a semiconductor device forming region), in a scribing region between semiconductor chip forming regions, or in a test semiconductor chip forming region (TEG). By the way, the first and second semiconductor elements 21 and 20 are manufactured according to equal manufacturing conditions. Further, if the semiconductor wafer itself is a test semiconductor wafer, the first semiconductor element 21 is arranged on the test semiconductor wafer.

The semiconductor device of this embodiment will be manufactured as described hereinafter. It is possible to accurately evaluate time-dependent degradations of electrical characteristics of the second semiconductor element 20, and to redesign it on the basis of evaluation results. Therefore, the semiconductor device having time-dependent degradations of electrical characteristics which meet product specification margins can be designed at an initial stage.

[Semiconductor Device Manufacturing Method]

Figure 14:
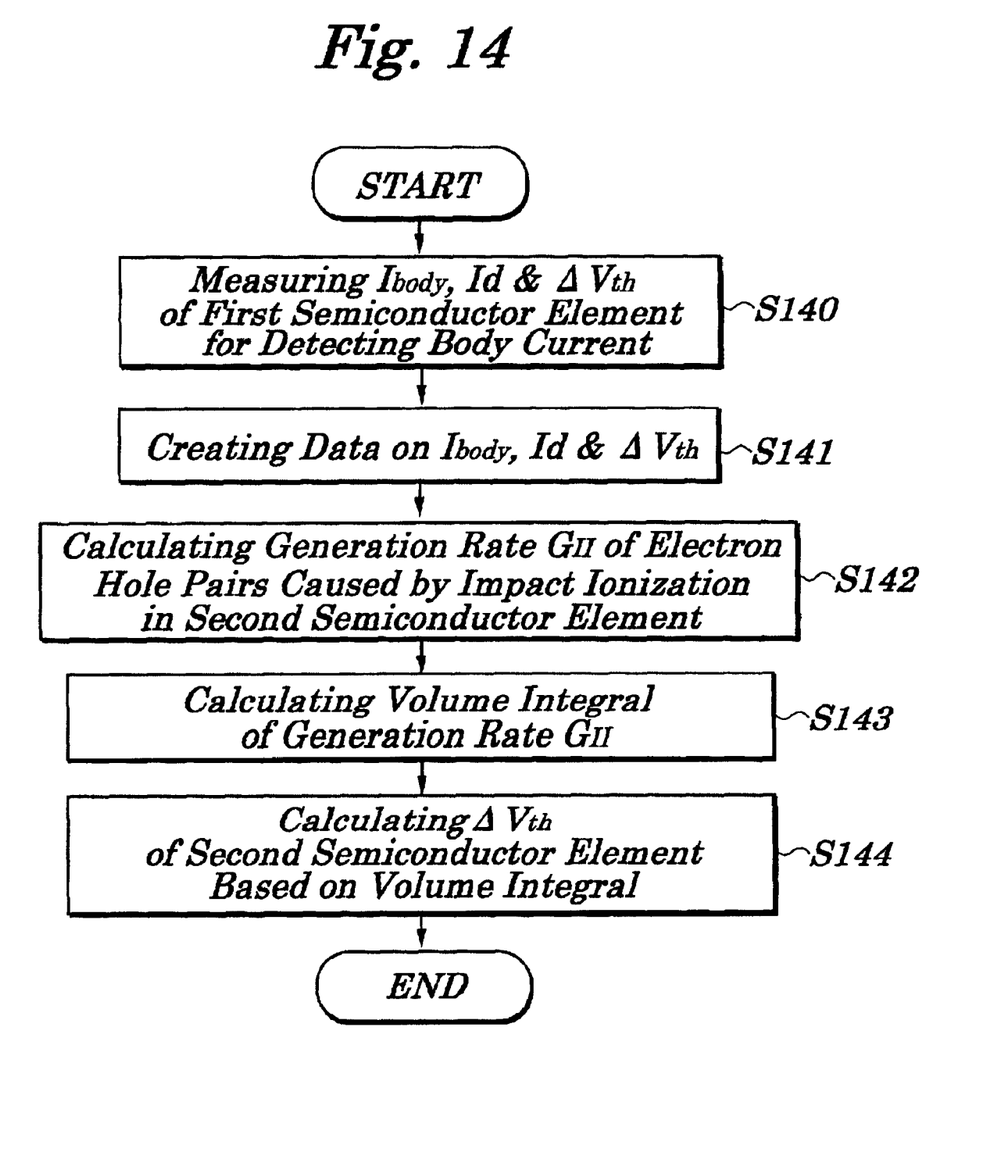
FIG. 14 is a flowchart showing the procedure for manufacturing the semiconductor device in the eighth embodiment.

The semiconductor device is manufactured according to steps shown in FIG. 14.

(1) First of all, the first semiconductor element 21 (i.e. the n-channel conductivity type IGFET) is formed on the first semiconductor active region 2. At least a body current $I_{body}$, a drain current Id and variations $\Delta V_{th}$ of a threshold voltage of the first semiconductor element 21 are measured (step S140). The body current $I_{body}$ is measured using the body contact electrode 7C.

(2) Data are created on the basis of the measured body current $I_{body}$, drain current Id and variations $\Delta V_{th}$ (step S141).

(3) The second semiconductor element 20 (i.e. the n-channel conductivity type IGFET) is formed on the second semiconductor active region 2. Thereafter, the generation rate $G_{II}$ of electron hole pairs caused by impact ionization is calculated for the second semiconductor element 20 (step S142).

(4) A volume integral of the generation rate $G_{II}$ of electron hole pairs is calculated for at least an area where the impact ionization is caused (step S143).

(5) The variations $\Delta V_{th}$ of the threshold voltage of the second semiconductor region 20 are calculated on the basis of the calculated volume integral and at least the body current $I_{body}$ (step S144).

In the eighth embodiment, the time-dependent degradations of electrical characteristics, i.e. the variations $\Delta V_{th}$ of the threshold voltage, of the second semiconductor element 20 can be easily calculated on the basis of the body current $I_{body}$ of the first semiconductor element 21.

(Ninth Embodiment of the Invention)

This embodiment relates to a method for performing evaluation business of semiconductor device.

The method comprises: evaluating time-dependent degradations of electrical characteristics of a semiconductor element or a circuit according to any one of manufacturing methods in the first to eighth embodiments; and notifying as evaluation results to clients who intend to use or are actually using semiconductor devices.

According to the ninth embodiment, clients can easily know time-dependent degradations of electrical characteristics of semiconductor devices, confirm the reliability thereof, or develop new semiconductor devices.

(Other Embodiments of the Invention)

Although the invention has been described with respect to some embodiments thereof, it will be understood by those skilled in the art that various modifications are possible without departing from the spirit of the present invention.

For instance, the n-channel conductivity type IGFET is used as the semiconductor element 20 in the first embodiment. Alternatively, the p-channel conductivity type IGFET may be used. Further, the invention is applicable to the evaluation of time-dependent degradations of electrical characteristics of circuits constituted by the foregoing IGFETs.

The invention can provide the semiconductor device manufacturing methods in which time-dependent degradations of dynamic electrical characteristics of the semiconductor element can be accurately and reliably evaluated.

Further, the invention can provide the semiconductor device manufacturing methods in which time-dependent degradations of dynamic electrical characteristics of the semiconductor elements can be accurately and reliably evaluated, when a substrate current does not function as an index representing hot carrier charges in the semiconductor active region, or when no substrate electrode is provided.

Still further, the invention can provide the semiconductor device manufacturing methods which can improve yield of the semiconductor devices.

Finally, the invention can provide the semiconductor devices or the electrical characteristics evaluating systems which can accurately and reliably evaluate time-dependent degradations of electrical characteristics of the semiconductor elements.

What is claimed is:

1. A method of manufacturing a semiconductor device, comprising:

forming a semiconductor element in a semiconductor active region, the semiconductor active region being an electrically floating state and calculating a generation rate of electron hole pairs caused by impact ionization in said semiconductor element;

calculating a volume integral of said generation rate of electron hole pairs in an area where the impact ionization is caused;

evaluating time-dependent variations of electrical characteristics of said semiconductor element on the basis of said volume integral; and manufacturing a semiconductor device based on results of the evaluating step.

2. The method of claim 1, wherein: calculating the generation rate of electron hole pairs comprises calculating the generation rate of electron hole pairs in an insulated gate field effect transistor formed in said semiconductor active region on an insulating layer of a substrate; and evaluating time-dependent variations of electrical characteristics of said semiconductor element is comprises evaluating time-dependent variations of electrical characteristics of said insulated gate field effect transistor.

3. The method of claim 1, wherein calculating said generation rate of electron hole pairs comprises calculating the generation rate of electron hole pairs in an insulated gate field effect transistor formed in said semiconductor active region on an insulating layer on a substrate or in said semiconductor active region on a sapphire substrate; and evaluating time-dependent variations of electrical characteristics of said semiconductor element comprises evaluating time-dependent variations of electrical characteristics of said insulated gate field effect transistor.

4. The method of claim 1, wherein calculating said generation rate of electron hole pairs comprises calculating the generation rate of electron hole pairs in an insulated gate field effect transistor formed in a semiconductor active region without any well electrode or body electrode; and evaluating time-dependent variations of electrical characteristics of said semiconductor element comprises evaluating time-dependent variations of electrical characteristics of said insulated gate field effect transistor.

5. The method of claim 1, wherein evaluating time-dependent variations of electrical characteristics of said semiconductor element is comprises evaluating time-dependent variations of a threshold voltage of an insulated gate field effect transistor on the basis of variations $\Delta V_{th}$ of a threshold voltage derived using the following equation $$\Delta V_{th} = A\left(\frac{I_{subQ}}{Id}\right)^{\alpha} Id^{\beta}$$

wherein $I_{subQ}$ denotes a pseudo current of a semiconductor active region, Id denotes a drain current, and A, $\alpha$ and $\beta$ denote model parameters.

6. The method of claim 1, wherein evaluating time-dependent variations of electrical characteristics of said semiconductor element comprises evaluating time-dependent variations of a driving current of an insulated gate field effect transistor.

7. The method of claim 1, wherein evaluating time-dependent variations of electrical characteristics of said semiconductor element comprises creating data concerning the relationship between stresses and variations of a threshold voltage in a certain time period under the stresses, and by evaluating time-dependent variations of a threshold voltage of an insulated gate field effect transistor on the basis of said data.

8. The method of claim 7, wherein evaluating time-dependent variations of said electrical characteristics of said semiconductor element comprises evaluating time-dependent variations of a threshold voltage of said insulated gate field effect transistor on the basis of empirically created or actually collected data representing at least the relationship between a predetermined current and variations of the threshold voltage.

9. The method of claim 1, wherein evaluating time-dependent variations of said semiconductor element comprises creating data concerning stresses at operating temperatures and variations of a threshold voltage in a certain time period under the stresses, and by evaluating on the basis of said data time-dependent variations of the threshold voltage of an insulated gate field effect transistor in operation.

10. A method of manufacturing a semiconductor device, comprising:

forming a semiconductor element in a semiconductor active region, the semiconductor active region being in an electrically floating state, and calculating the generation rate of electron hole pairs caused by impact ionization in said semiconductor element;

calculating a volume integral of said generation rate of electron hole pairs in an area where the impact ionization is caused;

calculating a time integral of physical quantities including the volume integral;

evaluating time-dependent variations of electrical characteristics of said semiconductor element on the basis of said time integral; and manufacturing a semiconductor device based on results of the evaluation step.

11. A method of manufacturing a semiconductor device, comprising:

forming a first insulated gate field effect transistor having a body contact electrode in a first semiconductor active region on an insulated film layer on a substrate, measuring at least a body current of said first semiconductor active region and creating data concerning at least said body current;

forming a second insulated gate field effect transistor without a body contact electrode in a second semiconductor active region, the semiconductor active region being in an electrically floating state, on said insulated film layer, and calculating the generation rate of electron hole pairs caused by impact ionization in said second insulated gate field effect transistor;

calculating a volume integral of said generation rate of electron hole pairs in a region where impact ionization is caused;

calculating time-dependent variations of electrical characteristics of said second insulated gate field effect transistor on the basis of said volume integral and the body current in said data; and manufacturing a semiconductor device on the basis of said calculated time-dependent variations of said electrical characteristics.

12. A method of manufacturing a semiconductor device, comprising:

performing initial designing of a semiconductor element to be formed in a semiconductor active region, the semiconductor active region being in an electrically floating state;

calculating the generation rate of electron hole pairs impact ionization in said semiconductor element;

calculating a volume integral of said generation rate of electron hole pairs in a region where said impact ionization is caused;

evaluating time-dependent variations of electrical characteristics of said semiconductor element on the basis of said volume integral; and redesigning said semiconductor element on results of the evaluating step.

13. A method of manufacturing a semiconductor device, comprising:

forming a semiconductor element in a semiconductor active region, the semiconductor active region being in an electrically floating state, and calculating the generation rate of electron hole pairs caused by impact ionization in said semiconductor element;

calculating a volume integral of said generation rate of electron hole pairs in a region where said impact ionization is caused;

calculating a physical model quantity after application of stresses to said semiconductor element, on the basis of said volume integral;

evaluating time-dependent variations of electrical characteristics after application of stress to said semiconductor element, on the basis of said calculated physical model quantities and manufacturing a semiconductor device based on results of the evaluating step.

14. The method of claim 13, wherein calculating the physical model quantity of said semiconductor element comprises calculating at least a density of an interface level on an interface of a gate insulating film of an insulated gate field effect transistor, a charge density measured in a gate insulating film or channel carrier mobility.

15. The method of claim 13, wherein forming said semiconductor element in said semiconductor active region is performed in accordance with the initial designing, the method further comprising:

evaluating time-dependent variations of electrical characteristics of said semiconductor element; and redesigning said semiconductor element based on results of the evaluating step.

* * * * *